United States Patent [19]

Shimoyama et al.

[11] Patent Number: 5,173,147

[45] Date of Patent: Dec. 22, 1992

[54] APPARATUS FOR SEALING A SEMICONDUCTOR PACKAGE HAVING FROSTED QUARTZ GLASS PIECE AND UV LIGHT SOURCE

[75] Inventors: Akio Shimoyama, Tenri; Kouki Kitaoka, Sakurai; Noriki Iwasaki, Nara, all of Japan

[73] Assignee: Sharp Kabushiki Kaisha, Osaka, Japan

[21] Appl. No.: 712,872

[22] Filed: Jun. 11, 1991

[30] Foreign Application Priority Data

Jun. 18, 1990 [JP] Japan .................................. 2-159553

[51] Int. Cl.⁵ .............................................. B27G 11/02
[52] U.S. Cl. .................................. 156/379.6; 437/215; 156/379.8; 156/538; 156/578
[58] Field of Search ................. 156/379, 379.6, 379.7, 156/379.8, 580, 538, 578; 437/215-219

[56] References Cited

U.S. PATENT DOCUMENTS

| | | | |
|---|---|---|---|
| 4,072,552 | 2/1978 | Ewing | 156/379.8 |
| 4,193,694 | 3/1980 | Smith | 356/407 |
| 4,418,284 | 11/1983 | Ogawa et al. | 156/273.5 X |
| 4,661,191 | 4/1987 | Kamio et al. | 156/275.5 |
| 4,685,200 | 8/1987 | Bokil | 437/215 |
| 4,976,802 | 12/1990 | LeBlanc | 156/273.9 X |

FOREIGN PATENT DOCUMENTS

| | | | |
|---|---|---|---|
| 203143 | 2/1989 | Japan | 156/379.6 |
| 4-76942 | 3/1992 | Japan | . |

OTHER PUBLICATIONS

Hackh's Chemical Dictionary, 4th ed., McGraw-Hill Book Co., 1969, p. 298.

*Primary Examiner*—David A. Simmons
*Assistant Examiner*—Chester T. Barry
*Attorney, Agent, or Firm*—Nixon & Vanderhye

[57] ABSTRACT

An apparatus for sealing a semiconductor package, which is used for performing a sealing operation, includes a unit for emitting ultraviolet rays, and a package base having an entrance surface and an exit surface. The package base between the entrance surface and the exit surface is made of quartz glass. The emitting means closely contacts the entrance surface. And ultraviolet rays emitting by the emitting unit are applied through the quartz glass to the semiconductor package which is mounted on the exit surface.

10 Claims, 4 Drawing Sheets

APPARATUS FOR SEALING A SEMICONDUCTOR PACKAGE HAVING FROSTED QUARTZ GLASS PIECE AND UV LIGHT SOURCE

BACKGROUND OF THE INVENTION

1. Field of the Invention

The present invention relates to an apparatus for sealing a semiconductor package by using a method of suppressing attenuation of illuminance of ultraviolet rays.

2. Description of the Related Art

The inventors know a method and an apparatus for sealing a semiconductor package. The description will be directed to such the known method and apparatus for sealing a semiconductor package made of a ultraviolet-ray-curing type resin (resin to be cured through the effect of radiation of ultraviolet rays).

In implementing the sealing method, there is provided a metallic package base as a fundamental base, on which a semiconductor package is placed. The ultraviolet-ray-curing type resin is coated on the semiconductor package. Then, an operator picks a lid with a pincette and puts the lid on a right position of the semiconductor package as he or she is visually making sure of the position. Next, the operator turns on a ultraviolet ray emitting instrument located above the semiconductor package with his one hand as applying a certain amount of pressure on the lid with the pincette in his other hand. The operator keeps the pressing state for a certain amount of time while the ultraviolet ray emitting instrument applies ultraviolet rays to the semiconductor package. Since the ultraviolet ray emitting instrument is located above the semiconductor package, the ultraviolet rays are applied to the semiconductor package through the atmosphere.

The foregoing method, however, has the following disadvantages.

(1) In case of keeping an estimated optimal distance for obtaining an optimal illuminance of the ultraviolet rays, the physical constraint resulting from a conveying system, for example, may often keep the actual distance between the ultraviolet ray emitting instrument and the to-be-applied surface longer than the estimated optimal distance. Since the illuminance of the ultraviolet rays is in inverse proportion to the distance, the illuminance is made lower by the difference between the actual distance and the estimated optimal distance, resulting in requiring a longer emitting time until the resin is cured.

(2) Since the positioning and pressurizing of the lid are done manually with the pincette, it takes a long time to do the positioning and the pressurizing. And, the lid-set position and applied pressure are so variable that the sealing operation is not often allowed to be done under the optimal conditions.

(3) Since the ultraviolet ray emitting instrument is located above the package base and applies the ultraviolet rays to the semiconductor package from above, the pincette pressing the lid becomes an obstacle to applying the ultraviolet rays on the overall surface of the semiconductor package uniformly. So, it results in lowering the sealing workability.

(4) Since the semiconductor package is directed upward during the sealing operation, the pincette pressing the lid may result in adhering dust to the semiconductor chip and causing damage to the lid surface.

SUMMARY OF THE INVENTION

It is therefore an object of the present invention to provide an apparatus for sealing a semiconductor package which is adapted to improve the sealing workability and seal a semiconductor package under the optimal conditions for realizing a semiconductor product with high productivity and high reliability.

The object of the present invention can be achieved by the apparatus for sealing a semiconductor package, which is used for performing a sealing operation, including a unit for emitting ultraviolet rays, and a package base having an entrance surface and an exit surface. The package base between the entrance surface and the exit surface is made of quartz glass. The emitting means closely contacts the entrance surface. And ultraviolet rays emitting by the emitting unit are applied through the quartz glass to the semiconductor package which is mounted on the exit surface.

In operation, the package base is made of quartz glass so that the unit for applying ultraviolet rays closely contacted under the quartz glass can directly emit the ultraviolet rays to the package base only within the quartz glass. Hence, by adjusting the length of the quartz glass to the optimal length, it is possible to most efficiently implement uniform emission of the ultraviolet rays.

By making the sides of the quartz glass of frosted glass, the reflecting and the lens effects are exerted within the quartz glass, thereby preventing the ultraviolet rays from being leaked outside. It results in being able to suppress the attenuation of the illuminance of the ultraviolet rays more than the atmosphere.

The apparatus for sealing a semiconductor package according to the invention makes it possible to easily position the lid and the semiconductor package and freely adjust the pressure applied to the semiconductor package and the emitting time of the ultraviolet rays, which are the conditons about sealing. Hence, it is possible to seal the semiconductor package under the optimal conditions.

Since the semiconductor package is directed downwardly in sealing, it is possible to prevent dust adhering to the chip and the lid from being damaged. Further, the present sealing apparatus is constructed so that the unit for applying ultraviolet rays to the semiconductor package, which has been an obstacle to the sealing operation, is fixed under the package base and the package pusher is positioned at such a place as not obstructing the sealing operation in non-use. Hence, the sealing operation is further improved.

The present sealing apparatus has the lid- and package-set base made of quartz glass and employs a method for suppressing attenuation of illuminance of the ultraviolet rays. It results in allowing the apparatus to seal the package with high reliability and high productivity.

Further objects and advantages of the present invention will be apparent from the following description of the preferred embodiments of the invention as illustrated in the accompanying drawings.

DESCRIPTION OF THE PREFERRED EMBODIMENT

Hereinafter, an embodiment of the invention will be described with reference to the drawings.

Figure 1:
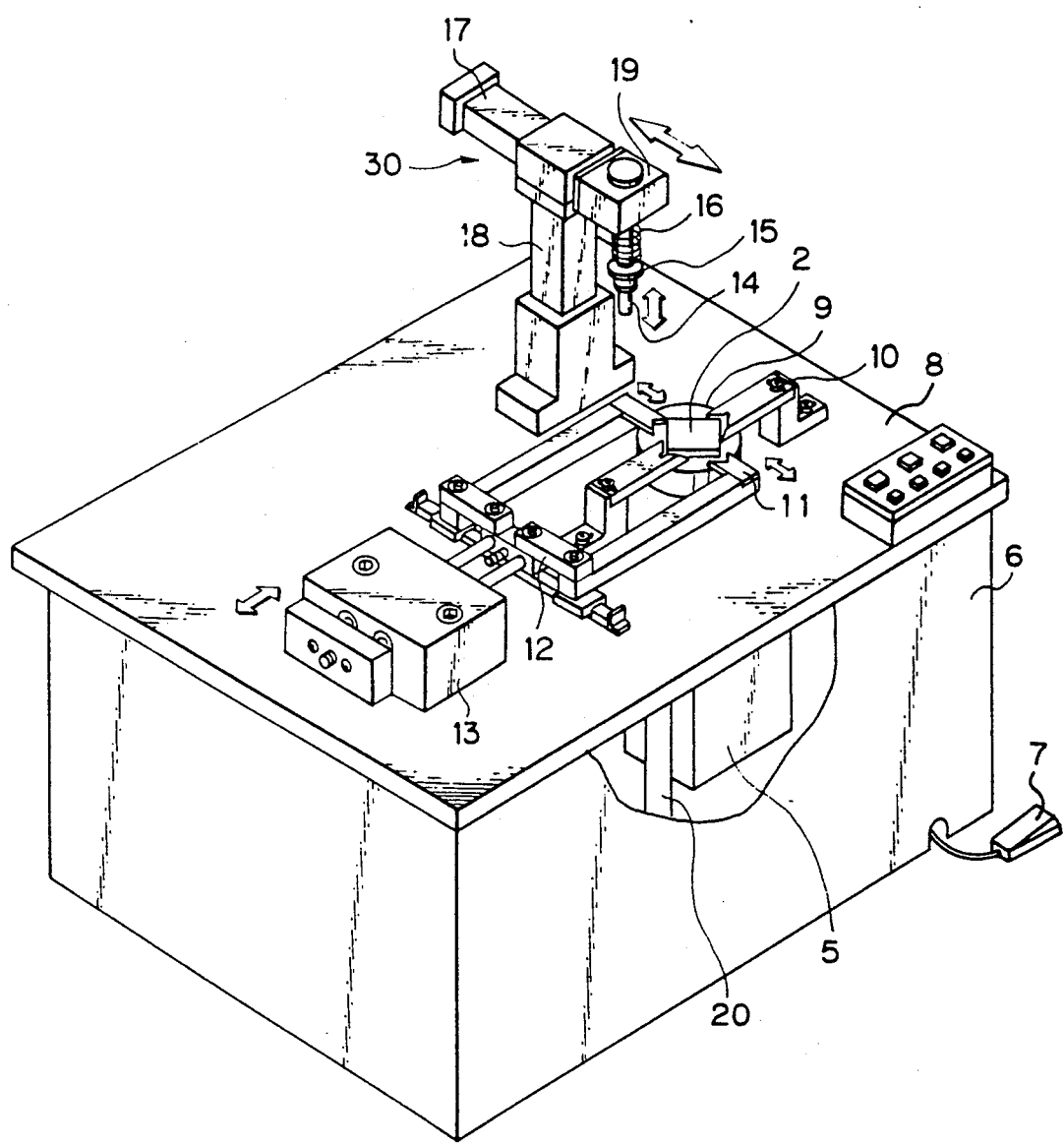
FIG. 1 is a perspective view showing partially-cut outer appearance of an embodiment of an apparatus for sealing a semiconductor package of the present invention.
Figure 4:
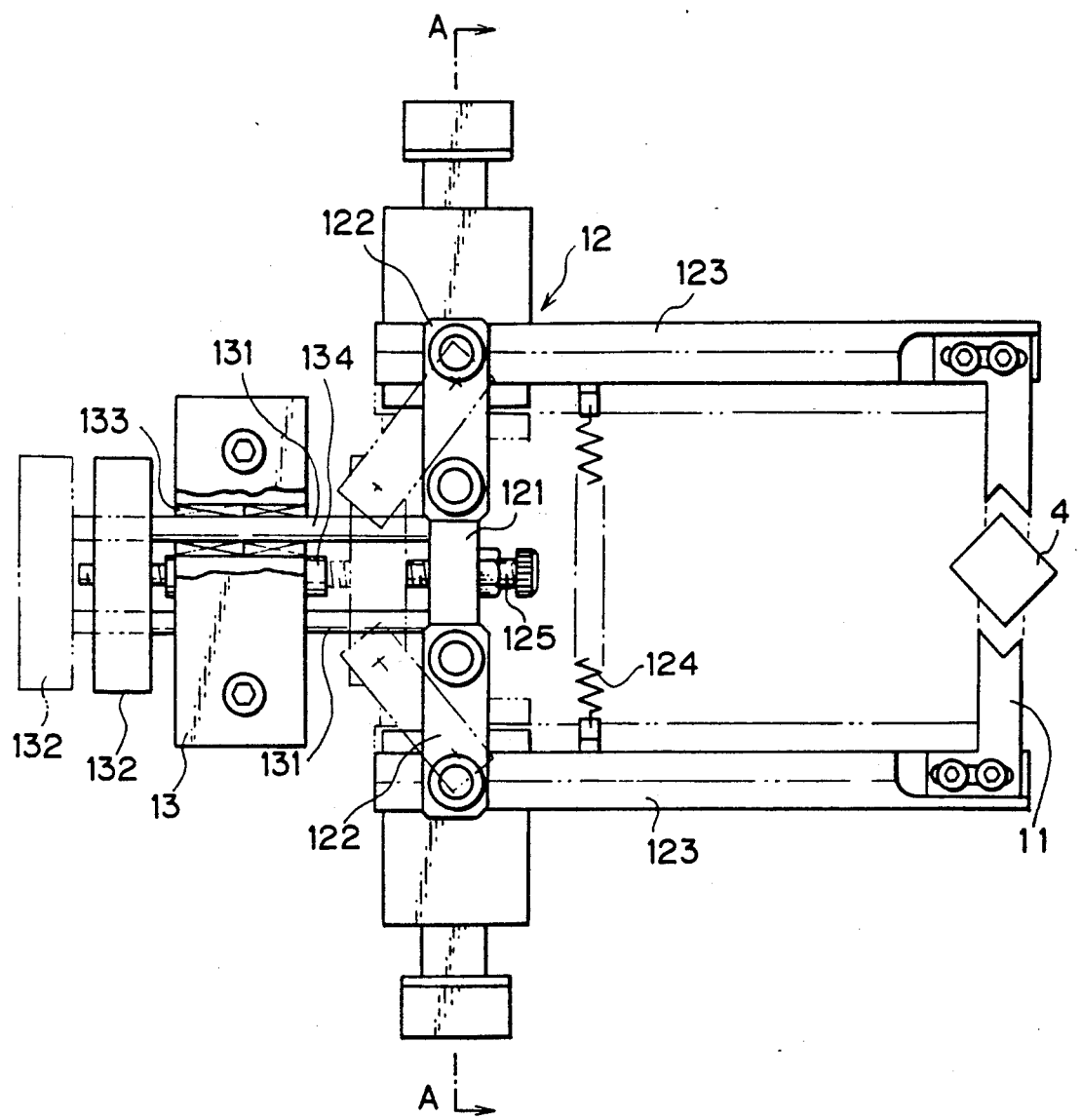
FIG. 4 is a partially-cut plane view showing the ultraviolet ray emitting instrument shown in FIG. 3.

As shown in FIG. 1, a reference numeral 6 denotes a semiconductor package sealing apparatus, which is the subject apparatus of the present invention. A reference numeral 8 denotes a base plate under which a ultraviolet ray emitting instrument 5 is located. A reference numeral 13 denotes a guided cylinder fixed on the base plate 8. As shown in FIG. 4, the guided cylinder 13 provides two rods 131 projected therefrom. One ends of both rods 131 are fixed on an operating rod 132, the middle portions are supported by liner ball bearings 133 provided in the guided cylinder 13, and the other ends, that is, the tip ends of both rods 131 are connected to a link mechanism 12.

Figure 3:
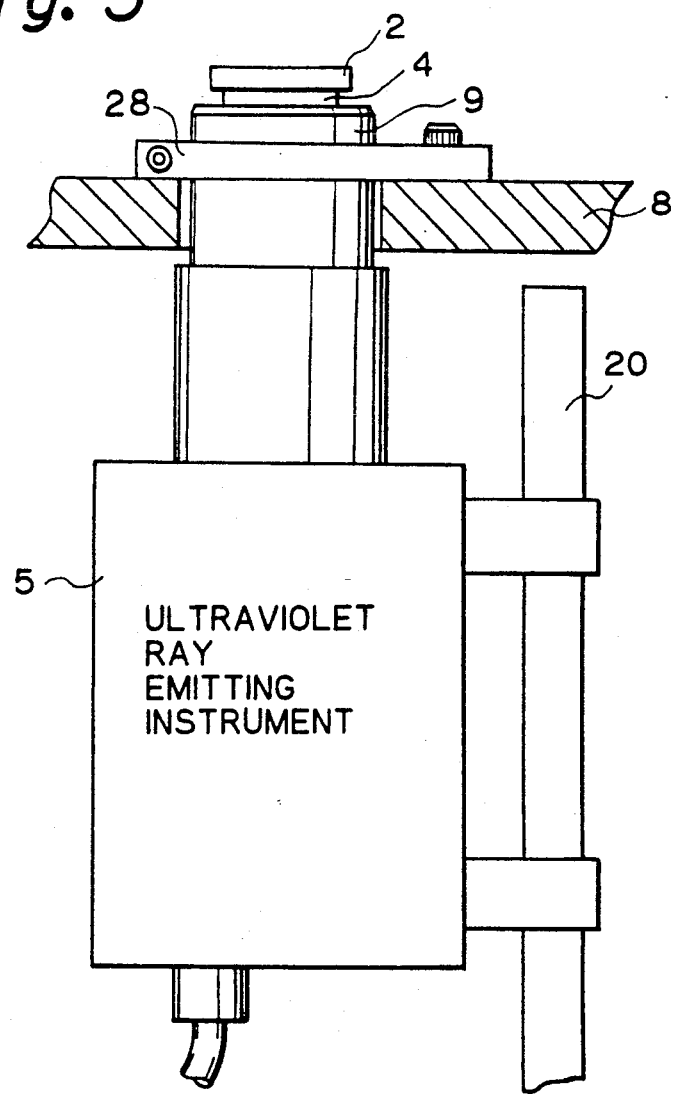
FIG. 3 is a side view showing a ultraviolet ray emitting instrument included in the apparatus for sealing a semiconductor package.

As shown in FIGS. 1 and 3, a reference numeral 9 denotes a package base made of quartz glass. The sides of the package base 9 are made of frosted quartz glass. The package base 9 is fixed to the ultraviolet ray emitting instrument 5 through the base plate 8 in the state that the package base 9 closely contacts to the ultraviolet ray emitting instrument 5. Hence, the ultraviolet ray emitting instrument 5 serves to apply a ultraviolet ray directly to the package base 9 without keeping the space between the ultraviolet ray emitting instrument 5 and the package base 9. A reference numeral 10 denotes a pair of package-positioning pawls fixed on the base plate 8. A reference numeral 2 denotes a package pressurized between a pair of the package-positioning pawls 10. A reference numeral 11 denotes a pair of lid-positioning pawls to be opened and shut in the direction shown by an arrow. The lid-positioning pawl 11 has a V-formed tip in the opposite side to the package 2. The package-positioning pawl 10 has a V-formed tip sloped downwardly so as to easily introduce the package 2. A reference numeral 4 denotes a lid pressurized between a pair of the lid-positioning pawls 11. A reference numeral 28 denotes a plate for fixing the package base 9, which is fixed on the base plate 8.

Figure 5:
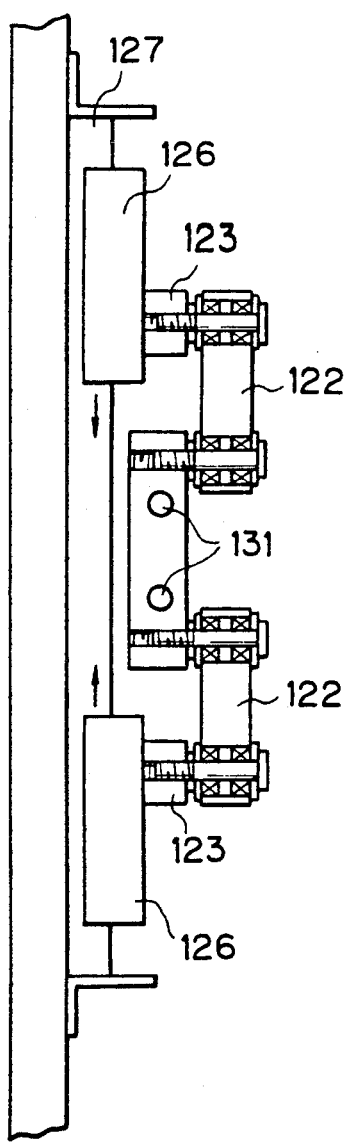
FIG. 5 is a sectional view cut on the line A—A of FIG. 4.

Turning to FIGS. 4 and 5, the link mechanism 12 includes a first arm 121 having two rods 131 fixed thereon, a pair of second arms 122 provided upward of the first arm 121 having the base end supported by a shaft and being capable of rotating in the direction orthogonal to the rods 131, a pair of third arms 123 rotatably supported at the tip of the second arm 122, a spring 124 fixed on the pair of third arms 123, and a stopper 125 provided on the first arm 121. The tip of each third arm 123 has each part of the lid-positioning pawl 11 in a manner to make the pair of lid-positioning pawls 11 be opposed to each other. Each third arm 123 has a linear guide 126 directed orthogonally to each part of the lid-positioning pawls 11. A reference numeral 127 denotes a linear guide rail.

With reference to FIG. 4, the operating rod 132 is positioned to the right hand and the pair of third arms 123 are opened. In this state, the first arm 121 and the pair of second arms 122 are ranged in a line. The ranging of the arms 121 and 122 in a line is kept stable even by being pulled by a spring 124. However, when the operating rod 132 is moved to the left (to the position shown by a broken line of FIG. 4), the first arm 121 is moved to the left as well. The movement of the first arm 121 to the left results in rotating the pair of second arms 122 on each base end and supporting portion, allowing the pair of third arms 123 to be closed by the spring 124, allowing a stopper 125 to come into contact with a projected portion 134 provided on the guided cylinder 13, and allowing the pair of lid-positioning pawls 11 to set the lid 4.

Figure 2:
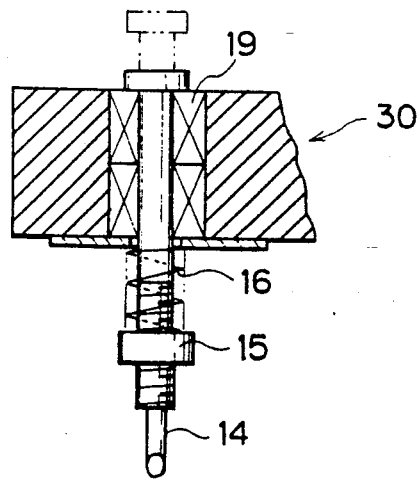
FIG. 2 is a sectional view showing a package-pressing portion of the embodiment of the apparatus for sealing a semiconductor package.

Turning to FIGS. 1 and 2, a reference numeral 30 denotes an applying pressure adjusting mechanism, which stands on the base plate 8 in such a position as not obstructing the setting operation of the lid 4 and the package 2. The applying pressure adjusting mechanism 30 includes a cylinder 17 with a Y-axis guide, a cylinder 18 with a Z-axis guide, and a package pusher 14.

After setting the lid 4 and the package 2, the applying pressure adjusting mechanism 30 is moved to the center of the package 2 by virtue of the cylinder 17 with the Y-axis guide and then is moved downward by virtue of the cylinder 18 with the Z-axis guide so that the package pusher 14 serves to apply a certain magnitude of pressure to the package 2.

As shown in FIG. 2, the package pusher 14 includes a relief mechanism 19 composed of ball bushes, a pressure adjusting spring 16, and a stopper 15 so that the package pusher 14 can freely adjust the pressure applied to the package 2.

Turning to FIG. 1, a reference numeral 7 denotes a foot switch and a reference numeral 20 denotes a mount shaft for mounting the ultraviolet ray emitting instrument 5.

In sealing the package 2, it is presumed that the sealing resin is stuck out of the package 2 and adheres to the lid-positioning pawl 11. Hence, it is necessary to relieve the lid-positioning pawl 11 before applying the pressure to the package 2. For the purpose, the cylinder 18 with the Z-axis guide has two-staged strokes. At the first stroke, the cylinder 18 serves to press the package 2 in a manner to lightly keep the lid 4 at a right place. After the lid-positioning pawl 11 is relieved, at the second stroke, the cylinder 18 serves to more strongly constant press the package 2 in a manner to firmly keep the lid 4 at the right place.

Figure 6:
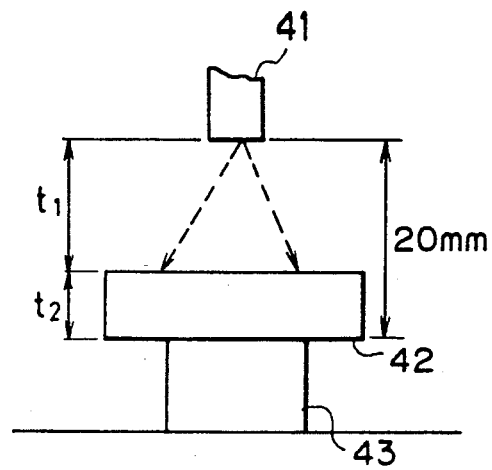
FIG. 6 is an explanatory view for explaining a method for suppressing attenuation of illuminance of ultraviolet rays.

FIG. 6 is an explanatory view for explaining a method of the present invention. As shown in FIG. 6, assuming that the distance between the light source 41 (the tip of a fiber) and a to-be-applied surface (the location where a sensor 43 of the ultraviolet ray illuminance measuring meter is placed) is 20 mm (millimeter) and each of four quartz glass plates 42 having respective thicknesses is inserted between the light source 41 and the to-be-applied surface, the illuminance of the ultraviolet ray was measured with respect to each quartz glass plate 42. The measuring result will be shown in the following Table 1.

TABLE 1

| Quartz Glass t2 (mm) | 0 | 2.3 | 5 | 12 | 20 |

TABLE 1-continued

| Space (air) t1 (mm) | 20 | 17.7 | 15 | 8 | 0 |
|---|---|---|---|---|---|
| Illuminance of Ultra-violet Ray (mW/cm²) | 78 | 79 | 88 | 110 | 145 |

As will be appreciated from the Table 1, as the thickness t2 of the quartz glass 42 is increased and the thickness t1 of the space (air) is decreased, the illuminance of the ultraviolet rays is increased. Further, the illuminance of the ultraviolet rays at the thickness 0 of the quartz glass 42 is nearly twice as large as that at the thickness 20 mm of the quartz glass 42.

The foregoing result indicates that the attenuation of the ultraviolet rays is reduced to a minimum by inserting the quartz glass between the light source and the to-be-applied surface in order to provide no space (air) therebetween.

Many widely different embodiments of the present invention may be constructed without departing from the spirit and scope of the present invention. It should be understood that the present invention is not limited to the specific embodiments described in the specification, except as defined in the appended claims.

What is claimed is:

1. An apparatus for sealing a semiconductor package, which is used for performing a sealing operation, comprising:
    means for emitting ultraviolet rays; and
    a package base having an entrance surface, an exit surface and a side surface between said entrance surface and said exit surface, said package base being formed of quartz glass, said side surface being formed of frosted quartz glass, said emitting means being in close spaced proximity to or contacting said entrance surface such that ultraviolet rays from said emitting means pass substantially only within the quartz glass of said package base to said semiconductor package which is mounted on said exit surface.

2. An apparatus according to claim 1, wherein said apparatus comprises means for positioning said semiconductor package on said package base.

3. An apparatus according to claim 1, wherein said apparatus comprises means for applying pressure on said semiconductor package when performing said sealing operation.

4. An apparatus according to claim 1, wherein said apparatus comprises means for positioning a lid being contacted to said semiconductor package by said sealing operation, and wherein said means for positioning said lid is comprised of a pair of lid-positioning pawls, said lid-positioning pawls being opposed to each other and each having a V-formed tip so as to allow said lid to be located between both of said V-formed tips.

5. An apparatus according to claim 2, wherein said means for positioning said semiconductor package is comprised of a pair of package-positioning pawls, each of said package-positioning pawls having V-formed and sloped tip so as to facilitate introduction of said semiconductor package between both of said V-formed and sloped tips.

6. An apparatus according to claim 1, wherein said apparatus comprises means for opening and shutting said lid-positioning means, said opening and shutting means being comprised of a link mechanism, said link mechanism including a first arm having two rods fixed thereon, a pair of second arms provided above said first arm and each having the base end rotatably supported by a shaft in an orthogonal manner to said rods, a pair of third arms rotatably supported at the tips of said pair of second arms respectively, a spring having both ends fixed on said pair of second arms, and a stopper provided on said first arm.

7. An apparatus according to claim 3, wherein said means for applying pressure on said semiconductor package is comprised of a pressure adjusting mechanism, said pressure adjusting mechanism located on said package base in a manner not to obstruct said sealing operation and including a Y-axis guided cylinder, a Z-axis guide cylinder, and a package pusher, said package pusher being movable to the center of said semiconductor package by said Y-axis guided cylinder and movable downwardly to said semiconductor package by said Z-axis guided cylinder.

8. An apparatus according to claim 7, wherein said pressure adjusting mechanism provides two-staged pressure-applying strokes when pushing said semiconductor package during said sealing operation.

9. An apparatus according to claim 1, wherein said means for emitting ultraviolet rays is located under said entrance surface of said package base, and a surface of said semiconductor package to which said ultraviolet rays are applied being directed downwardly.

10. An apparatus according to claim 9, wherein a thickness of said quartz glass is 20 mm.

* * * * *